(12) United States Patent
Mooij et al.

(10) Patent No.: US 6,201,682 B1
(45) Date of Patent: Mar. 13, 2001

(54) THIN-FILM COMPONENT

(75) Inventors: Jan H. Mooij; Henricus H.M. Wagemans; Joghum P. Venema, all of Roermond (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/212,629

(22) Filed: Dec. 16, 1998

(30) Foreign Application Priority Data

Dec. 19, 1997 (EP) .................................................. 97204027

(51) Int. Cl.$^7$ ........................... H01G 4/228; H01C 1/012
(52) U.S. Cl. .................... 361/306.1; 361/308.1; 361/310; 338/313
(58) Field of Search ............... 361/306.1, 306.2, 361/306.3, 308.1, 309, 310, 312, 311, 313, 320, 321.1, 321.5, 765, 763, 809, 807; 338/309, 313; 174/256

(56) References Cited
U.S. PATENT DOCUMENTS

| | | |
|---|---|---|
| 4,453,199 | 6/1984 | Ritchie et al. . |
| 4,847,136 * | 7/1989 | Lo ......................................... 428/195 |
| 4,855,872 | 8/1989 | Wojnar et al. . |
| 5,111,179 * | 5/1992 | Flassayer et al. ..................... 338/313 |
| 5,637,382 * | 6/1997 | Kataoka et al. ...................... 428/209 |

\* cited by examiner

*Primary Examiner*—Anthony Dinkins
(74) *Attorney, Agent, or Firm*—Norman N. Spain

(57) ABSTRACT

A thin-film component, for example a capacitor, a resistor and a coil, as well as combinations thereof. A substrate of an electrically insulating material (preferably glass), is provided with two U-shaped side contacts and with an electrical structure which is electrically connected to both side contacts. A flexible layer (preferably polyimide) is situated between the substrate and at least one of both legs of each of the U-shaped side contacts, which flexible layer is provided directly on the substrate surface, and in that the modules of elasticity of the material of the layer is below 50 GPa. By virtue of this measure, it is achieved that the components demonstrate a better resistance to standard bending tests. As a result, the product-failure percentage is reduced if these components are employed in flexible PCBs or in PCBs which are subjected to a vibration.

6 Claims, 1 Drawing Sheet

THIN-FILM COMPONENT

BACKGROUND OF THE INVENTION

The invention relates to a thin-film component comprising a substrate of an electrically insulating material, which is provided with two U-shaped side contacts as well as with an electrical structure, which is electrically connected to both side contacts. Examples of such electrical structures include resistive films, capacitor structures and coil structures as well as combinations thereof.

A thin-film component of the type mentioned in the opening paragraph is known per se. For example, in U.S. Pat. No. 4,453,199, a description of a thin-film capacitor of this type is given. This capacitor more particularly comprises a substrate of glass on which a capacitor structure is provided by means of vapor-deposition and sputtering. This capacitor structure is composed of electrode layers of aluminum or nickel and of dielectric layers of silicon dioxide. Said capacitor structure is further provided with a passivating or insulating cover layer of a synthetic resin, such as polyimide. The capacitor is constructed such that the capacitor structure is situated between the substrate and the cover layer. Said known component also comprises two side contacts. These side contacts are composed of a three-layer structure of chromium, nickel and silver, which is provided by means of sputtering.

In practice, it has been found that thin-film components of the known type have an important drawback, namely that an unacceptably high percentage of this type of components fails standard bending tests. In these tests, the electrical functioning of the components is monitored while the printed circuit board (PCB) on which the component is soldered is bent through a specific angle. Such bending tests give an indication of the possibility and, if so, the reliability of employing such components on flexible PCBs and on PCBs which are subjected to vibrations.

SUMMARY OF THE INVENTION

It is an object of the invention to obviate the above-mentioned drawback. The invention more particularly aims at providing a thin-film component whose ability to endure standard bending tests is better than that of the known components.

These and other objects of the invention are achieved by means of a thin-film component of the type mentioned in the opening paragraph, which, in accordance with the invention, is characterized in that a flexible layer is situated between the substrate and at least one of both legs of each of the U-shaped side contacts, which flexible layer is provided directly onto the substrate surface, and in that the modulus of elasticity of the material of the layer is smaller than 50 GPa.

The invention is also based on the experimentally gained realization that, after soldering the known component onto a PCB, mechanical stress concentrations may occur between the leg of the side contacts soldered to the substrate and the substrate itself. By means of visual inspection of a number of components which failed the bending tests, it has been established that these stress concentrations cause fracture in the substrate. This frequently results in undesirable changes in the electrical function of the component. The percentage of components which fail standard bending tests can be reduced substantially by providing a flexible layer between the leg to be soldered of both U-shaped side contacts. It has been found that the flexible layer is capable of coping with said stress concentrations.

It is noted that a flexible layer is to be taken to mean a layer of a material whose modulus of elasticity is smaller than 50 GPa. The modulus of elasticity of a material is the force per unit of material surface necessary to bring about a certain degree of deformation in said material. In practice, materials whose modulus of elasticity exceeds 50 GPa prove to be insufficiently flexible to absorb said stress concentrations to a sufficient degree. The best results are achieved with flexible layers of materials whose modulus of elasticity is smaller than 10 GPa.

In principle, all kinds of substrates of electrically insulating material can be used in a component in accordance with the invention, such as substrates of inorganic material, for example sintered substrates, for example, of aluminum oxide. The invention can also successfully be employed in thin-film components having a substrate of silicon. But most advantageously, a substrate of glass is used in the thin-film component. However, the problem of fracture caused by stress concentrations around the soldered side contacts is found to be most prominent in components having a glass substrate. It is noted that the modulus of elasticity of glass is approximately 100 GPa.

An advantageous embodiment of the thin-film component in accordance with the invention is characterized in that the flexible layer is provided on the surface of the substrate facing away from the electrical structure, and in that the layer substantially completely covers this surface. This embodiment offers very substantial production-technical advantages in the manufacture of thin-film components from glass wafers. In the case of the embodiment in which the electrical structure is provided on one main surface of the substrate and the flexible layer is provided on the other main surface, the flexible layer can be applied in a single run, without lithographic steps and etching steps, so as to substantially completely cover said main surface of the wafer. This aspect of the invention will be explained in greater detail in the examples.

DETAILED DESCRIPTION OF THE INVENTION

The invention will now be described in greater detail with reference to the figures of the drawing.

It is noted that the components in accordance with the last-mentioned embodiment can only be soldered on to a PCB in such a way that the electrical structure faces away from said PCB. The present invention can alternatively be used in components of which the electrical structure, after the soldering treatment, faces the PCB. In that case, the flexible layer and the electrical structure have to be provided on the same main surface of the substrate, and the flexible layer is preferably present only at the location of the leg of both U-shaped side contacts. This requires additional lithographic steps and etching steps when the flexible layer is provided. Finally, it is noted that the current invention can also be used in thin-film components which, in both configurations mentioned above, should be solderable onto a PCB. In that case, the flexible layer has to be present on both main surfaces of the substrate.

Another interesting embodiment of the thin-film component is characterized in that the flexible layer consists mainly of an organic synthetic resin. It has been found that, in particular, a large number of organic synthetic resins, especially organic polymers, have the desired modulus of elasticity. A polymer which can very suitably be used for this purpose is polyimide. Apart from the desired flexibility, the adhesion of this polymer to glass substrates is excellent.

It has been found that the thickness of the flexible layer preferably ranges between 5 and 50 micrometers. In the case of layers having a thickness below 5 micrometers, the effect of the invention (improved resistance in bending tests) can hardly be observed. If the layers are thicker than 50 micrometers, problems in the manufacture of the individual components from the wafers occur. An optimum compromise between both adverse effects is achieved when use is made of flexible layers having thicknesses in the range between 10 and 40 micrometers.

These and other aspects of the invention will be apparent from and elucidated with reference to the embodiments described hereinafter.

It is noted that, for clarity, the Figures are not drawn to scale.

Figure 1:
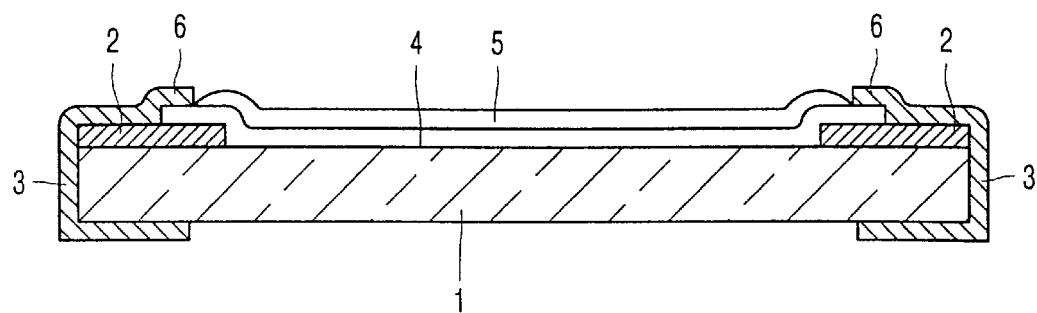
FIG. 1 is a schematic, sectional view of a first embodiment of the invented thin-film component.

FIG. 1 shows a first example of the invented thin-film component in the form of a thin-film resistor. This resistor comprises a substrate (1) of glass (Schott AF45) having dimensions of 1.6 mm by 0.8 mm and a thickness of 0.42 mm. At two ends of one of both main surfaces of the substrate, there is provided a flexible layer (2) of an organic synthetic resin (modulus of elasticity below 50 GPa), which in this case is polyimide. The thickness of the flexible layer is 20 micrometers. In addition, two U-shaped side contacts (3) are provided. These side contacts consist of a layer of vapor-deposited nickel. Said side contacts are provided in such a manner that the flexible layer at both ends of the substrate is situated exactly between the substrate surface and one of the legs (6) of each side contact.

The substrate is also provided with an electrical structure in the form of a thin-film resistive path (4). This path consists of sputtered NiCr material having a thickness of approximately 20 nanometers. The ends of the resistive path are electrically connected to both side contacts. Preferably, the resistive path is isolated by means of a cover layer (5), which preferably consists predominantly of an organic polymer. Good results are achieved with protective layers of polyimide.

The thin-film component described in FIG. 1 should be secured onto a PCB in such a manner that the legs (6) of the side contacts which are in direct contact with the flexible layer are soldered onto the PCB. After securing the component to a PCB, the substrate (1) serves as a protective layer for the resistive path (4).

Figure 2:
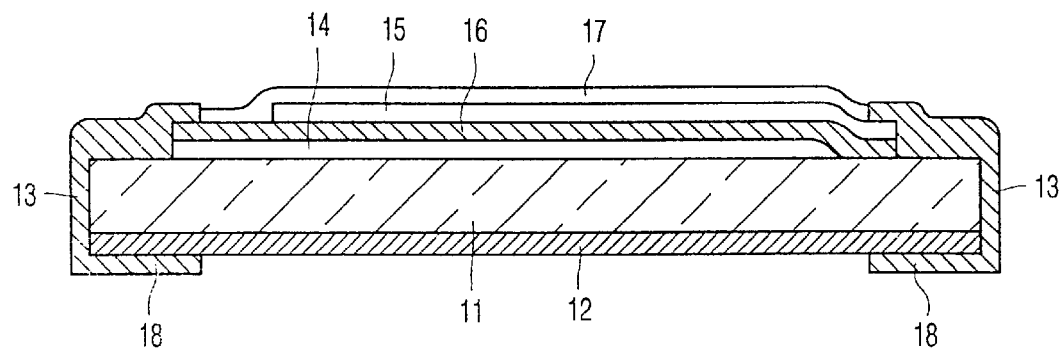
FIG. 2 is a schematic, sectional view of a second embodiment of the invented thin-film component.

FIG. 2 shows another example of the inventived thin-film component in the form of a thin-film capacitor. This capacitor also comprises a substrate (11) of glass (Schott AF45) having dimensions of 1.6 mm by 0.8 mm and a thickness of 0.42 mm. The main surface of the substrate facing away from the electrical structure is provided with a closed flexible layer (12) of an organic synthetic resin (modulus of elasticity below 50 GPa), which in this case is polyimide. The thickness of the flexible layer is approximately 15 micrometers. Further, two U-shaped side contacts (13) are provided. They consist of a layer of sputtered copper having a thickness of approximately 350 nanometers. The side contacts are provided in such a manner that the flexible layer is situated exactly between the substrate surface and one of the legs (18) of each side contact. Also in this example, the flexible layer is provided directly, i.e. without intermediate layers, onto the substrate.

The other main surface of the substrate is provided with an electrical structure in the form of a thin-film capacitor. This capacitor is composed of vapor-deposited first and second electrode layers (14, 15) of aluminium having a thickness of approximately 2 micrometers, between which a dielectric layer 16 of sputtered silicon nitride having a layer thickness of approximately 2 micrometers is sandwiched. One of the ends of each of the electrodes is connected to one of the side contacts (13). Preferably, the capacitor structure is isolated by means of a cover layer (17), which is preferably predominantly made of an organic polymer. Good results are achieved with protective layers of polyimide.

The thin-film component described in FIG. 2 should be secured to a PCB in such a manner that the legs (18) of the side contacts which are in direct contact with the flexible layer are soldered onto the PCB. After securing this component to a PCB, the electrical structure is situated on the surface of the substrate (11) facing away from the PCB. In this configuration, the component is protected by the cover layer (17).

Figure 3:
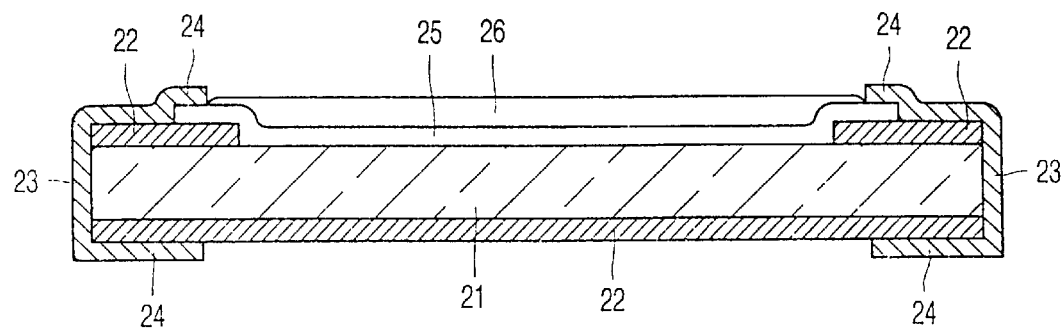
FIG. 3 is a schematic, sectional view of a third embodiment of the invented thin-film component.

FIG. 3 shows yet another example of the invented thin-film component in the form of a thin-film resistor. This resistor comprises a substrate (21) of glass (Schott AF45) having dimensions of 1.2 mm by 0.6 mm and a thickness of 0.42 mm. Two ends of one main surface as well as the entire other main surface of the substrate are provided with (parts of) a flexible layer (22) of an organic synthetic resin (modulus of elasticity below 50 GPa), in this case polyimide. The thickness of the flexible layer is approximately 35 micrometers. Further, two U-shaped side contacts (23) are provided. These side contacts consist of a layer of sputtered nickel. Said side contacts are provided in such a manner that the flexible layers on both main surfaces of the substrate are situated exactly between the substrate surfaces and both legs (24) of each of the side contacts.

The substrate is also provided with an electrical structure in the form of a thin-film resistive layer (25). This resistive layer is made of sputtered CuNi material having a thickness of approximately 20 nanometers. The ends of the resistive layer are electrically connected to both side contacts. Preferably, the resistive layer is isolated by means of a protective layer (26), which is preferably predominantly made of an organic polymer. Good results are achieved with protective layers of polyimide.

The thin-film component described in FIG. 3 has the important advantage that it can be secured to a PCB in two orientations. The electrical structure may either face the PCB or face away from the PCB. In either case, the effect of the invention (i.e. an improved resistance to bending) is achieved.

The following Table lists data on a standard bending test. In this test, a series A of 20 thin-film components in accordance with the invention, as described with respect to FIG. 2, were compared to a series B of 20 thin-film components in which the flexible layer (12) was absent. The components of both series were soldered onto a PCB in accordance with standard procedures. The bottom side of the PCB was subjected to a compressive force, while the PCB was fixed at the end portions. Said compressive force caused the PCB to be bent through a certain angle. The values X listed in the top line of the Table indicate the deflection (mm)

of the PCB at the location where the pressure is exerted relative to an imaginary connecting line between both fixation points. The distance between the fixation points was 90 mm. At each value of X, the number of components from both series exhibiting a change in the capacitance value of more than 10% is indicated (in a non-cumulative manner).

| X | 1 | 1.5 | 2 | 2.5 | 3 | 4 | 5 | 6 | 7 |
|---|---|-----|---|-----|---|---|---|---|---|
| A | — | —   | — | —   | — | — | — | 4 | 2 |
| B | — | —   | — | 4   | 2 | 2 | 1 | 2 | 5 |

The Table shows that the components in accordance with the invention exhibit a much higher resistance to standard bending tests than the components which are not according to the invention.

It is noted that the components in the Figures comprise only one electrical structure. However, the invention can equally well be used in so-called integrated thin-film components comprising more than one electrical structure. Examples of such components include RC, RL and RCL components. Other examples of such components are components comprising more than one electrical structure of the same type, such as resistance arrays or capacitor arrays.

The thin-film components in accordance with the invention can be manufactured on a substrate plate, for example a 6-inch glass wafer, by means of standard lithographic techniques. After cleaning the substrate plate, first, a flexible layer is applied. Dependent upon the type of component, either a continuous flexible layer may be provided (see FIG. 2) or the flexible layer must first be subjected to a structuring operation (see FIG. 1). Subsequently, the layers of the electrical structure and, if necessary, the protective layers are provided. Next, the substrate plate is converted into strips, for example by cutting or breaking. After the provision of the side contacts, the strips are converted into individual components, for example by cutting or breaking.

The thin-film components in accordance with the invention are provided with a thin flexible layer which is situated between the substrate and at least one of the legs of each U-shaped side contact. By virtue of this layer, the components in accordance with the invention demonstrate a better resistance to standard bending tests. As a result, the product-failure percentage is reduced if these components are employed in flexible PCBs or in PCBs which are subjected to a vibration.

What is claimed is:

1. A thin-film component comprising a substrate of an electrically insulating material, which substrate is provided with two U-shaped side contacts, each of said U-shaped side-contacts comprising two legs, as well as with an electrical structure, which electrical structure is electrically connected to both side contacts, characterized in that a flexible layer is situated between the substrate and at least one of both legs of each of the U-shaped side contacts, said flexible layer is provided directly onto a surface of the substrate and said flexible layer directly contacts said substrate on an opposite face from said electrical structure and each of the U-shaped side contacts wraps around and contacts said flexible layer and said electrical structure and in that the modulus of elasticity of the material of the flexible layer is smaller than 50 GPa.

2. A thin-film component as claimed in claim 1, characterized in that the substrate is made of glass.

3. A thin film component as claimed in claim 1, characterized in that the flexible layer is provided on the surface of the substrate facing away from the electrical structure, and in that said flexible layer completely covers said surface.

4. A thin-film component as claimed in claim 1, characterized in that the flexible layer consists mainly of an organic synthetic resin.

5. A thin-film component as claimed in claim 4, characterized in that the organic synthetic resin comprises a polyimide.

6. A thin-film component as claimed in claim 1, characterized in that the thickness of the flexible layer ranges between 5 and 50 micrometers.

* * * * *